(12) United States Patent
Sindalovsky et al.

(10) Patent No.: US 7,773,667 B2
(45) Date of Patent: Aug. 10, 2010

(54) PSEUDO ASYNCHRONOUS SERIALIZER DESERIALIZER (SERDES) TESTING

(75) Inventors: Vladimir Sindalovsky, Perkasie, PA (US); Lane A. Smith, Easton, PA (US); Ronald Lamar Freyman, Bethlehem, PA (US); Max Jay Olsen, Mertztown, PA (US)

(73) Assignee: Agere Systems Inc., Allentown, PA (US)

( * ) Notice: Subject to any disclaimer, the term of this patent is extended or adjusted under 35 U.S.C. 154(b) by 1230 days.

(21) Appl. No.: 11/181,286

(22) Filed: Jul. 14, 2005

(65) Prior Publication Data

US 2007/0014342 A1    Jan. 18, 2007

(51) Int. Cl.
H04B 3/46 (2006.01)
H04B 17/00 (2006.01)
H04Q 1/20 (2006.01)

(52) U.S. Cl. ..................................... 375/224
(58) Field of Classification Search .................. 375/224
See application file for complete search history.

(56) References Cited

U.S. PATENT DOCUMENTS

| | | | | |
|---|---|---|---|---|
| 7,376,528 B2* | 5/2008 | Ribo | .......................... | 702/108 |
| 2004/0066870 A1* | 4/2004 | Gabara et al. | ................ | 375/354 |
| 2004/0148580 A1* | 7/2004 | de Obaldia et al. | ............. | 716/4 |
| 2004/0268190 A1* | 12/2004 | Kossel et al. | ................. | 714/704 |
| 2006/0066374 A1* | 3/2006 | Tomita | ........................ | 327/291 |

OTHER PUBLICATIONS

T.P. Warwick, Y Cai, S.G. Rane, E. Masserrat, Digital Serial Device Communication Testing and Implication on Automatic Test Equipment Architecure, IEEE 2000.*

* cited by examiner

*Primary Examiner*—David C Payne
*Assistant Examiner*—Tanmay K Shah

(57) ABSTRACT

The various embodiments of the invention provide an apparatus, system and method of asynchronous testing a serializer and deserializer data communication apparatus (SERDES) for determining frequency and phase locking to pseudo asynchronous input data having a continual phase offset. An exemplary apparatus includes a data sampler adapted to sample input serial data and to provide output data; a controlled tap delay with a selected tap having a phase offset from the input serial data, in which the selected tap is selectively coupleable to the data sampler to provide pseudo asynchronous input serial data; a first variable delay control adapted to delay a reference frequency provided to the controlled tap delay in response to the pseudo asynchronous input serial data; and a second delay control adapted to adjust the plurality of taps in response to the pseudo asynchronous input serial data. In additional embodiments, the pseudo asynchronous input serial data is provided from an interpolated phase from at least two selected taps.

27 Claims, 5 Drawing Sheets

|  | S1 | T2 | S2 | PHASE ADJUSTMENT |
|---|---|---|---|---|
| CASE 1 | 0 | 1 | 1 | DOWN |
| CASE 2 | 1 | 0 | 0 | DOWN |
| CASE 3 | 0 | 0 | 1 | UP |
| CASE 4 | 1 | 1 | 0 | UP |
| CASE 5 | 1 | 0 | 1 | UP/DOWN |
| CASE 6 | 0 | 1 | 0 | UP/DOWN |
| CASE 7 | 1 | 1 | 1 | NO ACTION |
| CASE 8 | 0 | 0 | 0 | NO ACTION |

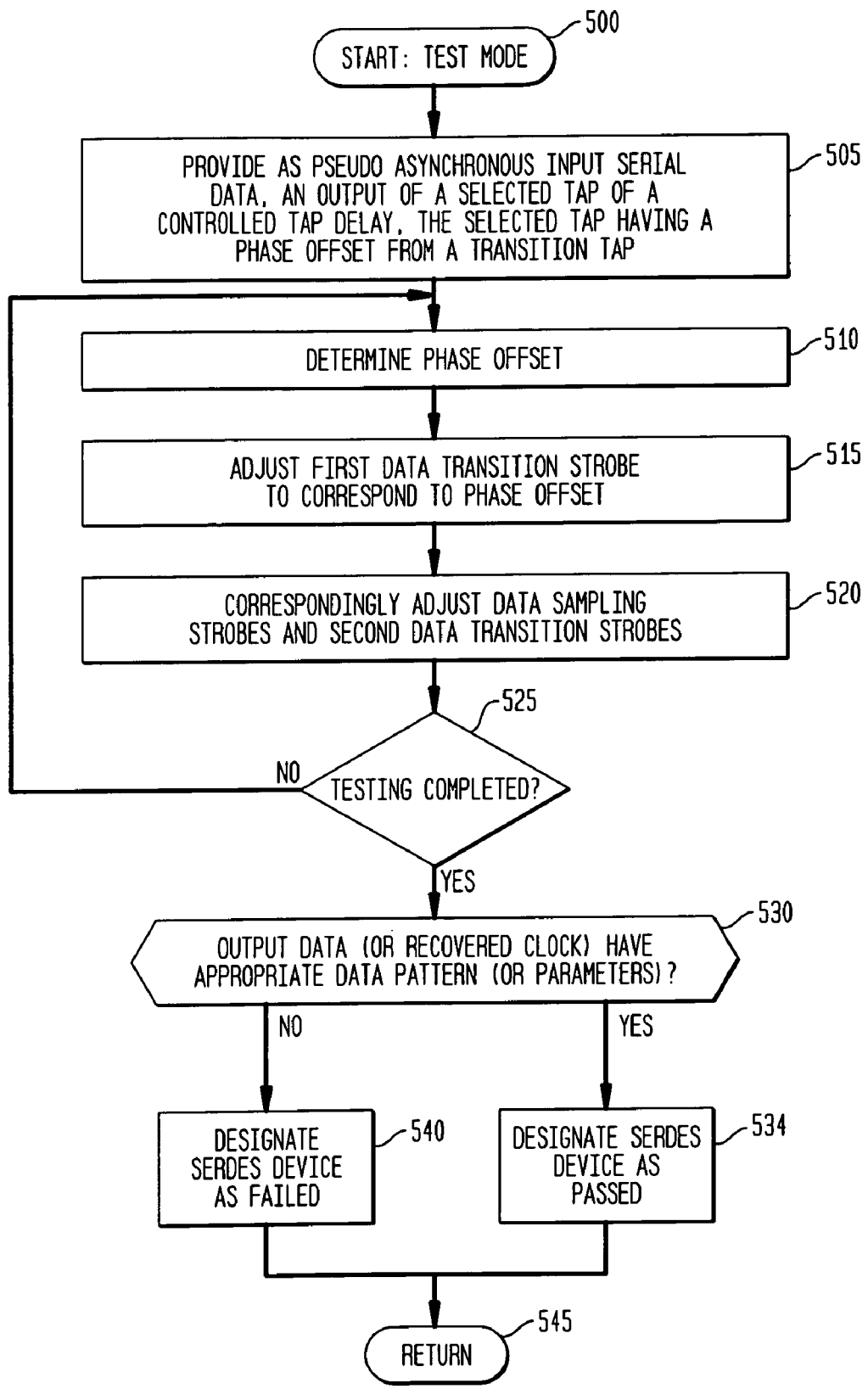

PSEUDO ASYNCHRONOUS SERIALIZER DESERIALIZER (SERDES) TESTING

FIELD OF THE INVENTION

This invention relates generally to testing of electronic equipment, and in particular, relates to high-speed asynchronous testing of serializer/deserializer devices, both in field applications and through automated test equipment, and is more particularly directed toward pseudo asynchronous testing of serializer/deserializer devices through application, as an input data stream, of an internally-generated bit stream having a predetermined phase offset.

BACKGROUND OF THE INVENTION

Serializer/deserializer ("SERDES") devices are frequently used in high-speed communication networks in which an interface must be provided between parallel bus-connected devices and high-speed serial communication networks, such as those implemented through optical fiber interconnections. Current SERDES devices utilize Voltage Controlled Delay Locked Loops ("VCDLs") to frequency and phase lock to an incoming serial data stream. Currently, SERDES devices are testing using either built-in self test ("BIST") modes or through board connections to external test equipment, such as automated test equipment ("ATE").

For both types of testing situations, the receive functionality of the SERDES device cannot be fully tested because the incoming serial data, generated by the SERDES device itself or through the external test equipment, is synchronous to the reference clock utilized in the VCDL. At the same time, there is no asynchronous clock available for testing using external test equipment (e.g., ATEs) or in BIST modes. As a consequence, in the prior art, the receive functionality of SERDES devices is only tested for frequency and phase locking to synchronous serial data, for both external test and BIST modes.

Such current testing modes are, as a consequence, insufficient. Such synchronous testing does not adequately test SERDES devices, particularly those having VCDL or other delay locked loops ("DLLs"), because not all possible delay combinations are tested. The SERDES devices are not tested fully to determine whether the devices accurately lock to asynchronous incoming data, for both frequency and phase.

Accordingly, a need arises for an apparatus, system and method that easily and efficiently permit asynchronous testing SERDES devices. Such testing should determine whether the devices accurately lock to asynchronous incoming data, for both frequency and phase, for all delay combinations.

SUMMARY OF THE INVENTION

The various embodiments provide for a pseudo asynchronous testing mode of a SERDES device in which frequency and phase adjustment of the SERDES device may be tested. In addition, such pseudo asynchronous testing may be provided in a wide variety of ways, using either integrated (on-chip) testing circuitry, or external testing circuitry.

Generally, testing of a SERDES device may include providing synchronous input serial data and training a plurality of taps of a controlled tap delay to the input serial data. An exemplary method for pseudo asynchronous testing a serializer/deserializer device, in accordance with the teachings of the present invention, comprises providing, as a pseudo asynchronous input serial data, an output of a selected tap of a plurality of taps of a controlled tap delay, in which the selected tap has a phase offset from a data transition tap (i.e., the tap location corresponding to transitions in the input data stream); adjusting the plurality of taps in response to the pseudo asynchronous input serial data; and comparing a corresponding output to a predetermined parameter. The output of the selected tap may be directly from one of the taps from the controlled tap delay, or may be an interpolated phase derived from or between taps of the controlled tap delay.

The step of adjusting the plurality of taps in response to the pseudo asynchronous input serial data may further comprise adjusting a first data transition tap of the plurality of taps to coincide with a data transition of the pseudo asynchronous input serial data, such as by delaying a phase of a reference frequency input into the controlled tap delay. Adjusting the plurality of taps typically includes adjusting a second data transition tap of the plurality of taps to coincide with a next data transition, adjusting a first data sampling tap of the plurality of taps to have a first corresponding phase between the first data transition tap and the second data transition tap, and adjusting a second data sampling tap of the plurality of taps to have a second corresponding phase between the second data transition tap and the first data transition tap. Typically, the relative phase between each of the first data transition tap, first data sampling tap, second data transition tap, and second data sampling tap is adjusted to be substantially ninety degrees (90°).

The adjusting of the plurality of taps in response to the pseudo asynchronous input serial data is typically continued until a predetermined number of adjustments of the plurality of taps have occurred in an increasing direction and in a decreasing direction. Alternatively, the adjusting continues for a predetermined period of time, which has been determined to be a sufficient period of time for a predetermined number of adjustments of the plurality of taps to have occurred in an increasing direction and in a decreasing direction.

In the exemplary embodiments, there are several variations on the step of comparing the corresponding output to the predetermined parameter. In a first embodiment, the output serial data is compared to a predetermined data pattern, determining a measured bit error rate of the output serial data, and providing a pass indication when the measured bit error rate is less than a first predetermined bit error rate or providing a fail indication when the measured bit error rate is greater than a second predetermined bit error rate. Generally, the predetermined data pattern is a serial bit pattern of one (1) alternating with zero (0). In another alternative, a frequency of a recovered clock of the pseudo asynchronous input serial data is compared to a reference frequency, and a pass indication is provided when the frequency of the recovered clock is within a predetermined frequency range or a fail indication is provided when the frequency of the recovered clock is not within a predetermined frequency range.

An exemplary apparatus for serializing and deserializing data comprises a data sampler, a controlled tap delay, a first variable delay control, and a second delay control. The data sampler is adapted to sample input serial data and to provide output data. The controlled tap delay has a plurality of taps, with a selected tap of the plurality of taps having a phase offset from a data transition tap (of either input data or the pseudo asynchronous input serial data), and the selected tap of the plurality of taps selectively coupleable to the data sampler to provide pseudo asynchronous input serial data, or selectively coupleable to the data sampler through an interpolator (to provide an interpolated phase from two or more selected taps) to provide pseudo asynchronous input serial data. The phase offset of the pseudo asynchronous input serial data is determined by the relative tap location of the selected tap(s) of the plurality of taps, such as the location of one selected tap, or of two selected taps when an interpolated phase is provided. The first variable delay control is coupled to the data sampler and to the controlled tap delay, and the first variable delay control is adapted to delay a reference frequency provided to the controlled tap delay in response to the pseudo asynchronous input serial data. The second delay control is coupled to the controlled tap delay and to the first variable delay control, the second delay control adapted to adjust the plurality of taps in response to the pseudo asynchronous input serial data.

In the exemplary embodiments, the first variable delay control is adapted to delay the reference frequency to provide that the first data transition tap of the plurality of taps is adjusted to coincide with a data transition of the pseudo asynchronous input serial data, and the second delay control is further adapted to adjust a second data transition tap of the plurality of taps to coincide with a next data transition. The second delay control is further adapted to adjust a first data sampling tap of the plurality of taps to have a first corresponding phase between the first data transition tap and the second data transition tap, and to adjust a second data sampling tap of the plurality of taps to have a second corresponding phase between the second data transition tap and the first data transition tap.

As indicated above, the first variable delay control is further adapted to continue to delay the reference frequency and the second delay control is further adapted to continuing the adjusting of the plurality of taps in response to the pseudo asynchronous input serial data until a predetermined number of adjustments of the plurality of taps have occurred in an increasing direction and in a decreasing direction.

In the various exemplary embodiments, the second delay control may further comprise: a phase detector coupled to the controlled tap delay and to the first variable delay control, the phase detector adapted to determine a phase difference between the phase of the controlled tap delay and the delayed reference frequency; a low pass filter coupled to the phase detector; and a delay control coupled to the low pass filter, to the first variable delay control and to the controlled tap delay, the delay control adapted to adjust corresponding delays of the first variable delay control and the controlled tap delay.

The exemplary apparatus may also include test circuitry coupled to the data sampler, the test circuitry adapted to compare a corresponding output to a predetermined parameter. In an exemplary embodiment, such test circuitry is further adapted to compare output serial data to a predetermined data pattern, such as a serial bit pattern of one (1) alternating with zero (0). The test circuitry is further adapted to determine a measured bit error rate, and to provide a pass indication when the measured bit error rate is less than a first predetermined bit error rate or provide a fail indication when the measured bit error rate is greater than a second predetermined bit error rate. In an alternative embodiment, the test circuitry is adapted to compare a frequency of a recovered clock of the pseudo asynchronous input serial data to a reference frequency, and to provide a pass indication when the frequency of the recovered clock is within a predetermined frequency range or provide a fail indication when the frequency of the recovered clock is not within a predetermined frequency range. In an exemplary embodiment, the test circuitry is integrated with the apparatus to form an exemplary system embodiment. Alternatively, in another embodiment, such test circuitry is coupled to the data sampler through external test equipment, to form another exemplary system embodiment.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, in which:

Figure (or "FIG.") 1 is a block diagram illustrating a first exemplary apparatus embodiment and a first exemplary system embodiment in accordance with the teachings of the present invention.

Figure 1:
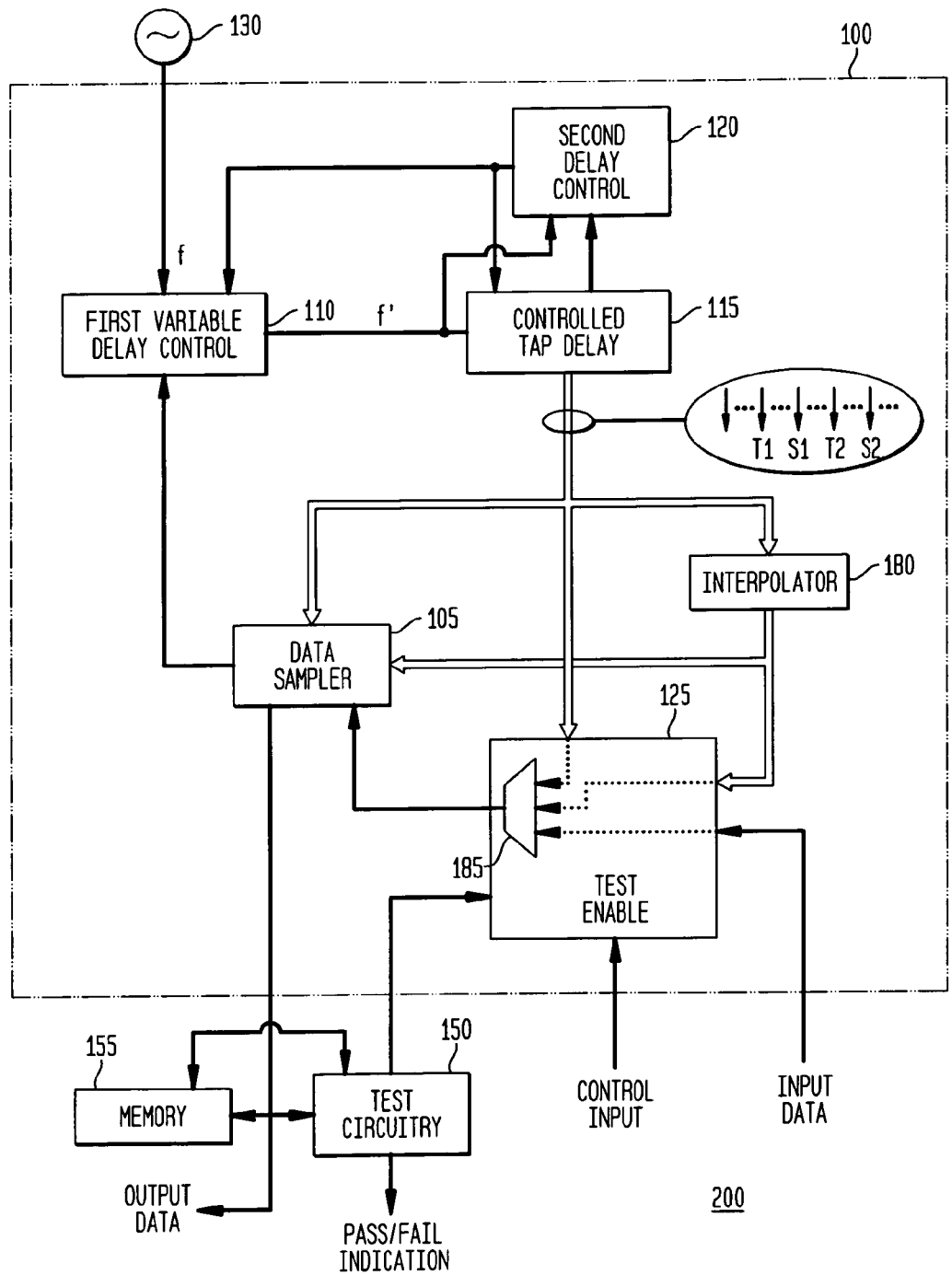

Figure (or "FIG.") 2 is a block diagram illustrating a second exemplary apparatus embodiment and a second exemplary system embodiment in accordance with the teachings of the present invention.

Figure (or "FIG.") 3 is a graphical diagram illustrating exemplary timing for data transition and data sampling strobes.

Figure (or "FIG.") 4 is a graphical diagram illustrating a zero tap delay for data transition and data sampling strobes in accordance with the teachings of the present invention.

Figure (or "FIG.") 5 is a graphical diagram illustrating a two tap delay for data transition and data sampling strobes in accordance with the teachings of the present invention.

Figure (or "FIG.") 6 is a table illustrating exemplary phase adjustment in accordance with the teachings of the present invention.

Figure (or "FIG.") 7 is a flow chart illustrating an exemplary method embodiment in accordance with the teachings of the present invention.

DETAILED DESCRIPTION OF THE EXEMPLARY EMBODIMENTS

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

Figure 2:
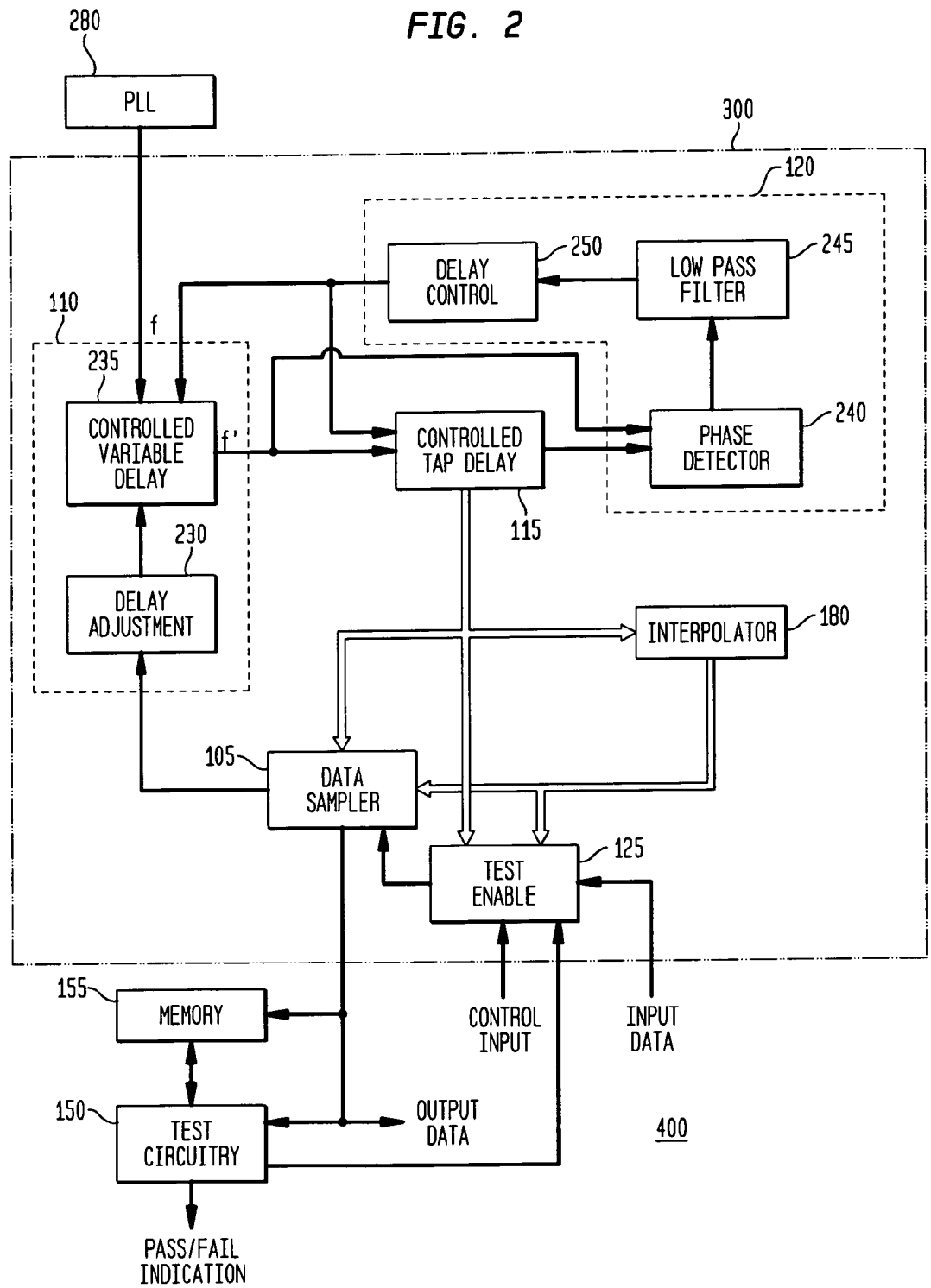

Referring now to the drawings wherein like reference numerals are used to identify identical components in the various views, FIG. 1 is a block diagram illustrating a first exemplary apparatus 100 embodiment and a first exemplary system 200 embodiment in accordance with the present invention. As illustrated in FIG. 1, the apparatus 100 is a serial/deserializer (SERDES) device including, without limitation, a data sampler 105, a first variable delay control 110, a controlled tap delay 115, and a second delay control 120. The SERDES apparatus 100 may also include an interpolator 180, such that when two or more taps are selected, and an interpolated phase from the taps is utilized to provide pseudo asynchronous data to the data sampler 105. The SERDES apparatus 100 may also include other components not illustrated in FIG. 1. The SERDES apparatus 100 is also configured or adapted to receive a reference frequency f, such as from reference frequency generator or oscillator 130, which may be an on-chip or external system clock, for example. Such an exemplary reference frequency generator 130 is illustrated as a phase locked loop ("PLL") 280 in FIG. 2. Exemplary embodiments of the first variable delay control 110 and second delay control 120 are also illustrated in FIG. 2. It will be apparent to those of skill in the art that any or all connections between and among the various illustrated components may be implemented in myriad equivalent ways, such as lines or busses, and all such variations are within the scope of the present invention.

Figure 3:
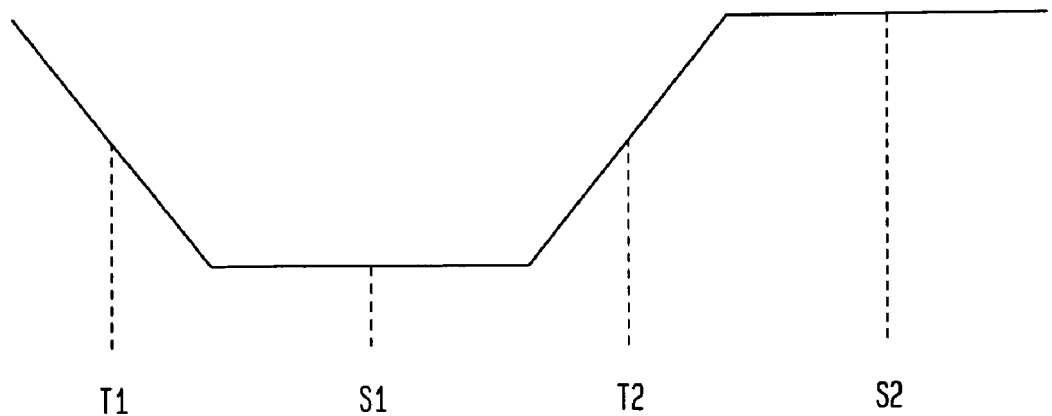

Depending upon the selected embodiment, the SERDES apparatus 100 may also include an integral test enable 125, which can be utilized to provide a test mode (as a BIST) and a data mode. As discussed in greater detail below, in a typical data mode, incoming data is coupled directly to data sampler 105. In contrast, for the testing mode of the present invention, as discussed in greater detail below, one of the taps from controlled tap delay 115 will be coupled, to provide a pseudo asynchronous input data stream, to data sampler 105, or two or more of the taps from controlled tap delay 115 will be coupled to interpolator 180, also to provide a pseudo asynchronous input data stream to data sampler 105 (illustrated as dotted input lines to a multiplexer (or other switching mechanism) 185, responsive to a control input, for selection of input data, selection of a tap from controlled tap delay 115, or selection of the output of interpolator 180, for input to data sampler 105). When an on-chip test enable 125 is not included, external connections may be utilized to provide such a test mode, in which one of the taps of a plurality of taps from controlled tap delay 115 is coupled through external connections to data sampler 105, such as through connections available on a test board, to also provide a pseudo asynchronous input data stream. Alternatively, two or more such taps may be connected externally to an interpolator, which is then connected to data sampler 105. Such external connections may be provided as part of a system 200. The plurality of taps from controlled tap delay 115 provide the frequency and phase alignment of the data transition and data sampling strobes; four taps of the plurality of taps are illustrated as data transition strobes T1 and T2, and data sampling strobes S1 and S2. Exemplary timing for data transition and data sampling strobes is illustrated in FIG. 3.

Continuing to refer to FIG. 1, the system 200 includes the SERDES apparatus 100 in conjunction with test circuitry 150 (which may be on-chip or off-chip (such as part of a testing board)), and may also include memory 155. The test circuitry 150 is utilized to determine if the data output during test mode is accurate, and provides a corresponding pass or fail indication. The test circuitry may be implemented as known in the art. The memory 155 may be on-chip or off-chip (such as part of a testing board), and may be any form of memory, whether volatile or non-volatile, whether removable or non-removable, including without limitation RAM, FLASH, DRAM, SDRAM, SRAM, MRAM, FeRAM, ROM, EPROM or E$^2$PROM, or any other type of memory, storage medium, or data storage apparatus or circuit, which is known or which becomes known, depending upon the selected embodiment.

In exemplary embodiments, an incoming serial data stream (input data) includes embedded clock information within its data transitions. As discussed in greater detail below, the first variable delay control 110 is utilized to provide a first delay of the reference frequency, namely, to provide a delayed frequency f' (f prime), into the controlled tap delay 115, to move its phase to match or lock to the incoming data stream, thereby recovering the embedded clock information and providing for substantially reliable and error-free data reception. The second delay control 120 it utilized to space or separate the data transition and data sampling strobes T1, S1, T2, and S2, to each be substantially one-half of a data bit unit interval (½ UI) apart, to adjust the overall delay of the controlled tap delay 115 to be substantially one period of the frequency f, and to provide consistency with the first delay. The first variable delay control 110 and the second delay control 120 may be implemented in a wide variety of ways, as known or may become known in the art. Exemplary embodiments are illustrated in greater detail with respect to FIG. 2. In addition, other configurations, such as combining both the first variable delay control 110 and the second delay control 120 into one feedback loop, are also within the scope of the present invention.

FIG. 2 is a block diagram illustrating a second exemplary apparatus 300 embodiment and a second exemplary system 400 embodiment in accordance with the present invention. As illustrated in FIG. 2, an exemplary embodiment of a first variable delay control 110 comprises a delay adjustment block 230 and a controlled variable delay block 235. An exemplary embodiment of a second delay control 120 comprises a phase detector 240, a low pass filter ("LPF") 245, and a delay control 250. A reference frequency generator is also illustrated as a phase locked loop ("PLL") 280, which generates a high speed clock from a system reference clock. The frequency f provided by PLL 280 is generally one-half of the desired data rate, such as f=2 GHz for a 4 Gbps data rate.

FIG. 3 is a graphical diagram illustrating exemplary timing for data transition strobes T1 and T2, and data sampling strobes S1 and S2, each of which are provided as a corresponding tap of the plurality of taps of controlled tap delay 115. As illustrated, four samples of the incoming data stream are taken, corresponding to 2 data bits, with the first data transition strobe T1 occurring at a high-to-low (1 to 0) transition, the first data sampling strobe S1 occurring during a stable point (such as substantially in the middle) of a data bit (low or 0), the second data transition strobe T2 occurring at a low-to-high (0 to 1) transition, and the second data sampling strobe S2 occurring during a stable point (such as substantially in the middle) of a data bit (high or 1).

Figure 4:
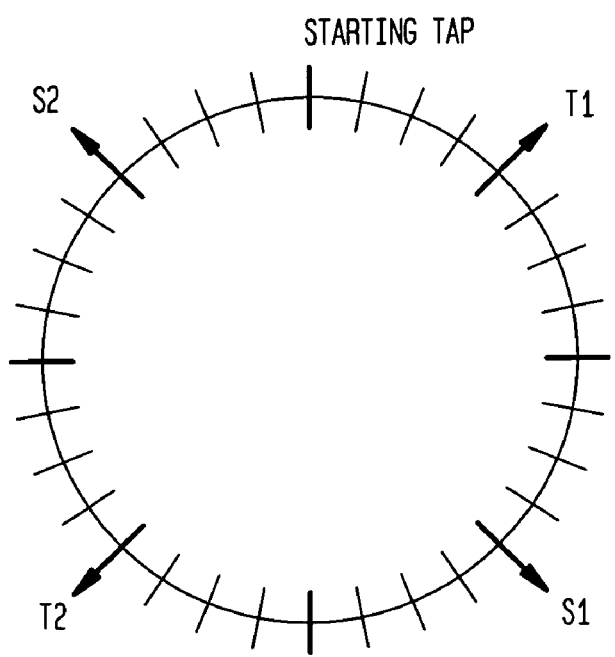

During data and testing modes, the controlled tap delay 115 provides strobes T1, S1, T2 and S2 to data sampler 105, to over sample incoming serial data. The controlled tap delay 115 provides taps from 0 ps to one period of the high speed clock (frequency f). Generally, when properly aligned and synchronized with incoming data, the various strobes T1, S1, T2 and S2 will be sequentially separated in phase by ninety degrees (90°), which each correspond to ½ UI, as illustrated in FIG. 4 for a zero tap delay for the data transition and data sampling strobes in accordance with the present invention. In order to coincide with data transitions, the first variable delay control 110 will provide a delay adjustment (in delay adjustment block 230) to variably delay the frequency f (in controlled variable delay block 235) input into controlled tap delay 115, to move its phase (forward/ahead or backward/behind) to match the phase of the incoming data stream, thereby adjusting the phase of T1 and T2 to coincide with and lock to the data transitions of the incoming serial data, allowing the data sampling strobes S1 and S2 to occur and sample data at stable data points.

Also during data and testing modes, the second delay control 120 will maintain the amount of delay between the plurality of taps of the controlled tap delay 115, such that strobes T1, S1, T2 and S2 are each separated sequentially by one-half a unit interval (½ UI), such that the points of data sampling occur substantially in the middle between data transitions. The second delay control 120 will compare (in phase detector 240) the phase of the delayed frequency f' input into the controlled tap delay 115 with the frequency output from the controlled tap delay 115, to move or force any phase difference substantially to zero, such that the bulk delay of the controlled tap delay 115 is substantially one period of The output of the phase detector 240, after low pass filtering (in low pass filter 245) is provided to delay control 250, which adjusts the per stage delay in both the controlled variable delay block 235 and controlled tap delay 115, to maintain consistency between their various delays, such that strobes T1, S1, T2 and S2 are each ½ UI. Both the controlled variable delay block 235 and the controlled tap delay 115 may be implemented using identical or similar delay stages, such that the phase delay control from delay control 250 can adjust the delay per stage to fit the full delay of one period of the high speed clock (frequency f).

As a consequence of this control, strobes T1, S1, T2 and S2 are each separated sequentially by one-half a unit interval, with T1 and T2 occurring at sequential data transition points, and S1 and S2 occurring at sequential data bit sampling points (as illustrated in FIG. 3). Referring to FIG. 4, when no delay is required, the starting tap of the controlled tap delay 115 is at 0° (zero degrees), with the strobes T1, S1, T2 and S2 each sequentially separated at 90°. When the incoming data stream has a delay greater or less than the T1 tap, the T1 tap will be adjusted to the data transition point, increasing/decreasing the delay provided by the controlled variable delay 235. These various changes in delay are illustrated in FIG. 5, for a two tap delay for data transition and data sampling strobes.

Figures 5, 6:
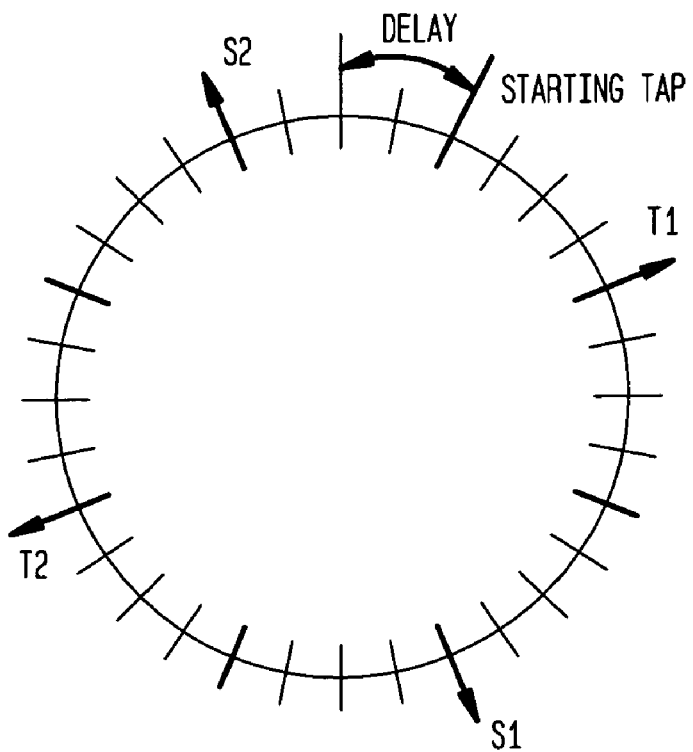

Figure (or "FIG.") 6 is a table illustrating exemplary phase adjustments of strobes S1, T2 and S2 in accordance with the teachings of the present invention. Referring to FIG. 6, as illustrated for Cases 1 and 2, a data bit transition has occurred from 0 to 1 (Case 1, S1=0 and S2=1) and 1 to 0 (Case 2, S1=1 and S2=0). In both of these cases, T2=S2, indicating that T2 has occurred late, at the stable part of the second data bit, indicating that its relative phase should be decreased (adjusted downward), decreasing its relative delay (to move closer to the data transition point). Similarly, as illustrated for Cases 3 and 4, a data bit transition has occurred from 0 to 1 (Case 3, S1=0 and S2=1) and 1 to 0 (Case 4, S1=1 and S2=0). In both of these cases, T2=S1, indicating that T2 has occurred early, at the stable part of the first data bit, indicating that its relative phase should be increased (adjusted upward), increasing its relative delay (to move closer to the data transition point). The amount of delay will be continually adjusted, jumping slightly earlier or later, without a steady state.

Cases 5 and 6 illustrate a worst (and unlikely) case, in which the data samples are occurring at transition points, as the T2 sample is different from both data samples (S1=S2≠T2, which should not occur, as no data transition is indicated). For both of these cases, T2 should be moved, either consistently increasing its relative delay or consistently decreasing its relative delay, which in both cases will move T2 closer to the data transition point. In Cases 7 and 8, in which S1=T2=S2, no adjustment is made, as no transition has been detected.

As indicated above, however, in the prior art, these phase adjustments have not been adequately tested, as no asynchronous signals are provided. As a consequence, in accordance with the present invention, a pseudo asynchronous data stream is provided, which is continually offset in phase, requiring the strobes T1, S1, T2 and S2 to be correspondingly adjusted, thereby providing an asynchronous testing mode. In accordance with the invention, one (or more) of the other taps of the plurality of taps of the controlled tap delay 115 is provided as the input data steam either directly to data sampler 105 (such as through a switch or multiplexer within test enable 125, or through the provision of external connections (such as testing board connections)), or indirectly, through an interpolator 180. Such a test enable is adapted to selectively couple an output of the selected tap to an input data line in response to a control input, such as a user or other input designating a testing mode or a data mode.

In an exemplary embodiment, a tap is selected which is two taps or stages behind/ahead of the T1 strobe, and provided as the input data stream to data sampler 105. In another exemplary embodiment, two or more taps are selected which are two or more taps or stages behind/ahead of the T1 strobe, and their interpolated phase (as transitions) are provided as the input data stream to data sampler 105. As a consequence, the phase detected will appear as a transition point slightly behind/ahead the data, and the delay for T1 will be increased/decreased to be closer to the data transition point, resulting in moving T1 by two taps (toward the selected tap used to provide input data). In accordance with the invention, the delay of the selected tap(s) has also been correspondingly increased/decreased with the movement of T1. As it has now been adjusted, the input data stream provided by the selected tap(s) is also correspondingly offset from the new position of T1, and the detected phase difference will once again result in the delay for T1 being increased/decreased to be closer to the data transition point, resulting in moving T1 by two taps (again toward the selected tap(s) used to provide input data). As a result, the phase of the incoming data (from the selected tap(s)) will be continually offset from T1, which will be caused to continually move. With the movement of T1, the remaining strobes S1, T2 and S2 will correspondingly move, also providing for asynchronous testing.

It will be apparent that both directions of phase alignment can be tested in accordance with the teachings of the present invention, through the selection of the appropriate tap (in relation to T1) of the controlled tap delay 115. As the controlled tap delay 115 is typically implemented as a circular buffer, this process can repeat cyclically, without overflow or underrun of the taps.

It will also be apparent that the recovered data pattern should be alternating states (S1≠S2), 010101 . . . or 101010 . . . , when the frequency and phase adjustment of the SERDES device (100, 300) of the invention is operating properly. If a SERDES device is operating improperly, this data pattern will not occur, and can be measured as a bit error rate, which should be below a predetermined level. In addition, when the frequency and phase adjustment of the SERDES device (100, 300) of the invention is operating properly, the recovered clock signal will have a different frequency than the frequency f of the reference frequency generator 130 (or PLL 280), and should be within a predetermined range of expected frequencies (the recovered clock will have continual delays, resulting in fewer transitions, which may be counted and compared to the transitions of the reference frequency).

As a consequence, test circuitry 150 may be implemented to evaluate the output data resulting from pseudo-asynchronous input data provided by utilizing one or more selected taps of the controlled tap delay 115, and to provide a corresponding pass or fail indication. In addition, the output data may be stored in memory 155, for evaluation at a subsequent time. Using the teachings of the present invention, therefore, allows testing of the SERDES device with incoming data which is continually out of phase with the frequency reference, providing a means to determine whether the SERDES device will be able to change its phase to accommodate asynchronous incoming data.

Figure (or "FIG.") 7 is a flow chart illustrating an exemplary method embodiment in accordance with the present invention, and provides a useful summary of the present invention. Generally, although not required, in advance of the frequency and phase testing, the SERDES device will have been provided with input serial data, and will have trained a plurality of taps of a controlled tap delay to the input serial data. As illustrated in FIG. 7, the testing mode begins, start step 500, with coupling one or more selected taps of a controlled tap delay to provide incoming serial data, such as by coupling one selected tap through a switch, a multiplexer, or external connections directly to the incoming data line, or by coupling a plurality of taps through an interpolator and then through any of these various switches, a multiplexers, or external connections, to the incoming data line, step 505. Next, the method determines the phase offset between the pseudo asynchronous incoming data and the reference frequency (or delayed reference frequency), step 510, and correspondingly adjusts the first data transition strobe T1 for the detected phase offset, step 515, increasing or decreasing its delay. The data sampling strobes (S1, S2) and second data transition strobe are also correspondingly adjusted, to increase or decrease their delays, step 520. When the testing has not been completed, step 525, the testing process continues, returning to step 510, to again determine the phase offset. When the testing has been completed in step 525, the method determines whether the output data (or the recovered clock) has the appropriate data pattern (or corresponding parameters, such as frequency difference from the reference frequency, based on counted transitions), step 530. When the appropriate data pattern or parameters have been met in step 530, the SERDES device under test may be designated as passed, step 535, and when these conditions have not been met in step 530, the SERDES device under test may be designated as failed, step 540. Following either step 535 or 540, the testing method may end, return step 545.

Numerous advantages of the present invention are readily apparent. The various exemplary embodiments provide for a pseudo asynchronous testing mode of a SERDES device in which frequency and phase adjustment of the SERDES device may be tested. In addition, such pseudo asynchronous testing may be provided in a wide variety of ways, using either integrated (on-chip) testing circuitry, or external testing circuitry.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A method for pseudo asynchronous testing of a serializer/deserializer device, the method comprising:
providing, as a pseudo asynchronous input serial data, an output of a selected tap of a plurality of taps of a controlled tap delay, the selected tap having a phase offset from a data transition tap of a plurality of data transition taps of the plurality of taps;
adjusting the plurality of taps in response to the pseudo asynchronous input serial data wherein a first data transition tap of the plurality of data transition taps is adjusted to coincide with a data transition of the pseudo asynchronous input serial data and a second data transition tap of the plurality of data transition taps is adjusted to coincide with a next data transition;
comparing a corresponding output to a predetermined parameter; and
providing a pass indication when a measured parameter is one of above or below a threshold with respect to the predetermined parameter or providing a fail indication when the measured parameter is the other of above or below the threshold with respect to the predetermined parameter.

2. The method of claim 1, further comprising:
delaying a phase of a reference frequency input into the controlled tap delay.

3. The method of claim 1, further comprising:
adjusting a first data sampling tap of the plurality of taps to have a first corresponding phase between the first data transition tap and the second data transition tap; and
adjusting a second data sampling tap of the plurality of taps to have a second corresponding phase between the second data transition tap and the first data transition tap.

4. The method of claim 3, further comprising:
adjusting a relative phase between each of the first data transition tap, first data sampling tap, second data transition tap, and second data sampling tap to be substantially ninety degrees (90°).

5. The method of claim 1, wherein the phase offset of the pseudo asynchronous input serial data is selected from the relative tap location of the selected tap of the plurality of taps.

6. The method of claim 1, further comprising:
continuing the adjusting of the plurality of taps in response to the pseudo asynchronous input serial data until a predetermined number of adjustments of the plurality of taps have occurred in an increasing direction and in a decreasing direction.

7. The method of claim 1, wherein the step of comparing the corresponding output to the predetermined parameter further comprises:
comparing output serial data to a predetermined data pattern;
determining a measured bit error rate of the output serial data; and
providing a pass indication when the measured bit error rate is less than a first predetermined bit error rate or providing a fail indication when the measured bit error rate is greater than a second predetermined bit error rate.

8. The method of claim 7, wherein the predetermined data pattern is a serial bit pattern of one (1) alternating with zero (0).

9. The method of claim 1, wherein the step of comparing the corresponding output to the predetermined parameter further comprises:
comparing a frequency of a recovered clock of the pseudo asynchronous input serial data to a reference frequency; and
providing a pass indication when the frequency of the recovered clock is within a predetermined frequency range or providing a fail indication when the frequency of the recovered clock is not within a predetermined frequency range.

10. The method of claim 1, wherein the step of providing, as a pseudo asynchronous input serial data, the output of a selected tap of the plurality of taps further comprises providing the output as an interpolated phase from at least two selected taps of the plurality of taps.

11. An apparatus for serializing and deserializing data, the apparatus comprising:
a data sampler adapted to sample input serial data and to provide output data;
a controlled tap delay having a plurality of taps, a selected tap of the plurality of taps having a phase offset from a data transition tap of a plurality of data transition taps of the plurality of taps, the selected tap of the plurality of taps selectively coupleable to the data sampler to provide pseudo asynchronous input serial data;

a first variable delay control coupled to the data sampler and to the controlled tap delay, the first variable delay control adapted to delay a reference frequency provided to the controlled tap delay in response to the pseudo asynchronous input serial data;

a second delay control coupled to the controlled tap delay and to the first variable delay control, the second delay control adapted to adjust the plurality of taps in response to the pseudo asynchronous input serial data; and test circuitry coupled to the data sampler, the test circuitry adapted to compare a corresponding output to a predetermined parameter.

12. The apparatus of claim 11, wherein the first variable delay control is adapted to delay the reference frequency to provide that a first data transition tap of the plurality of data transition taps is adjusted to coincide with a data transition of the pseudo asynchronous input serial data.

13. The apparatus of claim 12, wherein the second delay control is further adapted to adjust a second data transition tap of the plurality of data transition taps to coincide with a next data transition.

14. The apparatus of claim 13, wherein the second delay control is further adapted to adjust a first data sampling tap of the plurality of taps to have a first corresponding phase between the first data transition tap and the second data transition tap, and to adjust a second data sampling tap of the plurality of taps to have a second corresponding phase between the second data transition tap and the first data transition tap.

15. The apparatus of claim 14, wherein the second delay control is further adapted to adjust a relative phase between each of the first data transition tap, first data sampling tap, second data transition tap, and second data sampling tap to be substantially ninety degrees (90°).

16. The apparatus of claim 11, wherein the phase offset of the pseudo asynchronous input serial data is determined by the relative tap location of the selected tap of the plurality of taps.

17. The apparatus of claim 11, wherein the test circuitry is further adapted to compare output serial data to a predetermined data pattern.

18. The apparatus of claim 17, wherein the predetermined data pattern is a serial bit pattern of one (1) alternating with zero (0).

19. The apparatus of claim 17, wherein the test circuitry is further adapted to determine a measured bit error rate, and to provide a pass indication when the measured bit error rate is less than a first predetermined bit error rate or provide a fail indication when the measured bit error rate is greater than a second predetermined bit error rate.

20. The apparatus of claim 17, wherein the test circuitry is further adapted to compare a frequency of a recovered clock of the pseudo asynchronous input serial data to a reference frequency, and to provide a pass indication when the frequency of the recovered clock is within a predetermined frequency range or provide a fail indication when the frequency of the recovered clock is not within a predetermined frequency range.

21. The apparatus of claim 17, wherein the test circuitry is integrated with the apparatus.

22. The apparatus of claim 17, wherein the test circuitry is coupled to the data sampler through external test equipment.

23. The apparatus of claim 11, wherein the first variable delay control is further adapted to continue to delay the reference frequency and the second delay control is further adapted to continuing the adjusting of the plurality of taps in response to the pseudo asynchronous input serial data until a predetermined number of adjustments of the plurality of taps have occurred in an increasing direction and in a decreasing direction.

24. The apparatus of claim 11, wherein the second delay control further comprises:

a phase detector coupled to the controlled tap delay and to the first variable delay control, the phase detector adapted to determine a phase difference between the phase of the controlled tap delay and the delayed reference frequency;

a low pass filter coupled to the phase detector; and a delay control coupled to the low pass filter, to the first variable delay control and to the controlled tap delay, the delay control adapted to adjust corresponding delays of the first variable delay control and the controlled tap delay.

25. The apparatus of claim 11, further comprising:

a test enable coupled to the controlled tap delay and to the data sampler, the test enable adapted to selectively couple an output of the selected tap to an input data line in response to a control input.

26. The apparatus of claim 11, further comprising:

an interpolator coupled to the controlled tap delay, the interpolator adapted to provide an interpolated phase of at least two selected taps of the plurality of taps as the pseudo asynchronous input serial data.

27. A method for pseudo asynchronous testing a serializer/deserializer device, the method comprising:

providing, as a pseudo asynchronous input serial data, an output of at least one selected tap of the plurality of taps;

adjusting the plurality of taps in response to the pseudo asynchronous input serial data, until a predetermined number of adjustments of the plurality of taps have occurred in an increasing direction and in a decreasing direction, by adjusting a first data transition tap of the plurality of taps to coincide with a data transition of the pseudo asynchronous input serial data by delaying a phase of a reference frequency input into the controlled tap delay; adjusting a second data transition tap of the plurality of taps to coincide with a next data transition; adjusting a first data sampling tap of the plurality of taps to have a first corresponding phase between the first data transition tap and the second data transition tap; and adjusting a second data sampling tap of the plurality of taps to have a second corresponding phase between the second data transition tap and the first data transition tap;

comparing output serial data to a predetermined data pattern;

determining a measured bit error rate of the output serial data; and providing a pass indication when the measured bit error rate is less than a first predetermined bit error rate or providing a fail indication when the measured bit error rate is greater than a second predetermined bit error rate.

* * * * *